US011532717B2

(12) United States Patent
Wang et al.

(10) Patent No.: US 11,532,717 B2
(45) Date of Patent: *Dec. 20, 2022

(54) FORMING METAL CONTACTS ON METAL GATES

(71) Applicant: Taiwan Semiconductor Manufacturing Co., Ltd., Hsin-Chu (TW)

(72) Inventors: Chao-Hsun Wang, Taoyuan County (TW); Yu-Feng Yin, Hsinchu County (TW); Kuo-Yi Chao, Hsinchu (TW); Mei-Yun Wang, Hsin-Chu (TW); Feng-Yu Chang, Kaohsiung (TW); Chen-Yuan Kao, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 17/176,020

(22) Filed: Feb. 15, 2021

(65) Prior Publication Data

US 2021/0167179 A1 Jun. 3, 2021

Related U.S. Application Data

(63) Continuation of application No. 16/572,084, filed on Sep. 16, 2019, now Pat. No. 10,923,573, which is a (Continued)

(51) Int. Cl.
*H01L 27/085* (2006.01)
*H01L 29/423* (2006.01)
(Continued)

(52) U.S. Cl.
CPC .. *H01L 29/42364* (2013.01); *H01L 21/28026* (2013.01); *H01L 29/42372* (2013.01);
(Continued)

(58) Field of Classification Search
CPC combination set(s) only.
See application file for complete search history.

(56) References Cited

U.S. PATENT DOCUMENTS 5,268,330 A * 12/1993 Givens ............... H01L 21/321
438/631
5,990,021 A 11/1999 Prall et al.
(Continued)

FOREIGN PATENT DOCUMENTS

TW 430996 B 4/2001

OTHER PUBLICATIONS

Hitoshi Itoh, Mechanism for Initial Stage of Selective Tungsten Growth Employing a WF6 and SiH4 Mixture, Journal, Jan. 21, 1991, 5 pages, vol. 30, No. 7, Japanese Journal of Applied Physics, Japan.

*Primary Examiner* — Niki H Nguyen
(74) *Attorney, Agent, or Firm* — Haynes and Boone, LLP

(57) ABSTRACT

A semiconductor structure includes a metal gate structure comprising a gate dielectric layer and a gate electrode, a conductive layer disposed over the metal gate structure, and a contact feature in direct contact with the top portion of the conductive layer, where the conductive layer includes a bottom portion disposed below a top surface of the metal gate structure and a top portion disposed over the top surface of the metal gate structure, and where the top portion laterally extends beyond a sidewall of the bottom portion.

20 Claims, 8 Drawing Sheets

Related U.S. Application Data continuation of application No. 15/883,238, filed on Jan. 30, 2018, now Pat. No. 10,418,453.

(60) Provisional application No. 62/589,711, filed on Nov. 22, 2017.

(51) Int. Cl.
*H01L 29/45* (2006.01)
*H01L 21/28* (2006.01)
*H01L 29/49* (2006.01)
*H01L 29/78* (2006.01)
*H01L 29/66* (2006.01)

(52) U.S. Cl.
CPC .......... *H01L 29/45* (2013.01); *H01L 29/4925* (2013.01); *H01L 29/4958* (2013.01); *H01L 29/4966* (2013.01); *H01L 29/66545* (2013.01); *H01L 29/78* (2013.01); *H01L 29/66795* (2013.01); *H01L 29/785* (2013.01)

(56) References Cited

U.S. PATENT DOCUMENTS

| | | | |
|---|---|---|---|
| 6,037,263 A | 3/2000 | Chang | |
| 6,392,302 B1 * | 5/2002 | Hu | H01L 27/10873 257/E21.654 |
| 6,504,214 B1 * | 1/2003 | Yu | H01L 21/28194 257/411 |
| 6,642,566 B1 * | 11/2003 | Mandelman | H01L 27/10891 257/302 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,450,099 B1 * | 9/2016 | Chang | H01L 23/485 |
| 9,520,482 B1 | 12/2016 | Chang et al. | |
| 9,524,965 B2 * | 12/2016 | Ho | H01L 21/823475 |
| 9,576,814 B2 | 2/2017 | Wu et al. | |
| 9,985,023 B1 * | 5/2018 | Liu | H01L 21/76897 |
| 10,043,879 B1 * | 8/2018 | Kim | H01L 29/66795 |
| 10,153,203 B2 * | 12/2018 | Wang | H01L 21/76889 |
| 10,411,113 B2 * | 9/2019 | Wu | H01L 29/78 |
| 10,490,458 B2 * | 11/2019 | Perng | H01L 21/28176 |
| 10,867,852 B2 * | 12/2020 | Yeh | H01L 21/3085 |
| 10,923,573 B2 * | 2/2021 | Wang | H01L 29/4958 |
| 11,244,832 B2 * | 2/2022 | Lin | H01L 29/66545 |
| 2008/0087966 A1 | 4/2008 | Tai et al. | |
| 2010/0044783 A1 * | 2/2010 | Chuang | H01L 21/28114 438/589 |
| 2011/0156107 A1 * | 6/2011 | Bohr | H01L 29/785 257/E21.409 |
| 2013/0113050 A1 * | 5/2013 | Adkisson | H01L 29/36 257/E21.409 |
| 2013/0187203 A1 * | 7/2013 | Xie | H01L 29/78 257/288 |
| 2014/0217482 A1 * | 8/2014 | Xie | H01L 29/6653 257/288 |
| 2014/0231885 A1 * | 8/2014 | Xie | H01L 29/6656 438/585 |
| 2014/0252496 A1 * | 9/2014 | Liu | H01L 21/32134 438/586 |
| 2015/0041905 A1 * | 2/2015 | Xie | H01L 29/517 257/369 |
| 2015/0214341 A1 * | 7/2015 | Shin | H01L 27/0886 438/425 |
| 2015/0348965 A1 * | 12/2015 | Chang | H01L 27/092 438/585 |
| 2016/0027901 A1 * | 1/2016 | Park | H01L 29/785 438/300 |
| 2016/0049399 A1 | 2/2016 | Park et al. | |
| 2016/0133721 A1 * | 5/2016 | Cai | H01L 21/32053 257/506 |
| 2016/0276455 A1 * | 9/2016 | Yang | H01L 21/28247 |
| 2016/0343664 A1 | 11/2016 | Lavoie et al. | |
| 2016/0365449 A1 * | 12/2016 | Chang | H01L 29/4232 |
| 2018/0033866 A1 | 2/2018 | Liao et al. | |

\* cited by examiner

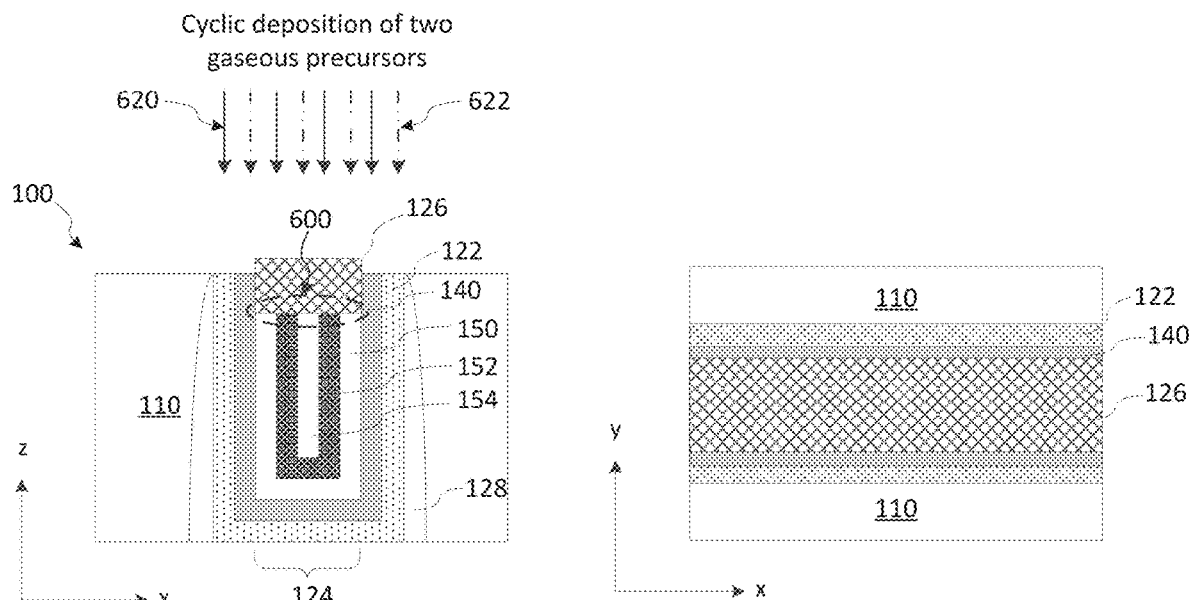
FIG. 6A
FIG. 6B
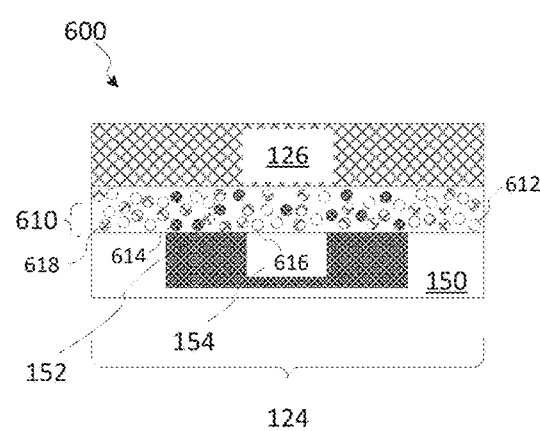
FIG. 6C

FORMING METAL CONTACTS ON METAL GATES

CROSS-REFERENCE TO RELATED APPLICATIONS

This is a Continuation of U.S. application Ser. No. 16/572,084, filed Sep. 16, 2019, which is a Continuation of U.S. application Ser. No. 15/883,238, filed Jan. 30, 2018, which claims the benefits of U.S. Provisional Application Ser. No. 62/589,711, entitled "Forming Metal Contacts on Metal Gates" and filed Nov. 22, 2017, the entire disclosure of which is hereby incorporated.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, polysilicon gates have been replaced by metal gates in an effort to improve device performance with decreased feature size. However, there are challenges associated with forming contact features on metal gates during device fabrication. In one example, interface between a contact feature and a metal gate can experience high resistance that is difficult to control due to reduced feature size. As a result, improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 4A, 5, 6A, 6C, 7A, 8A, 9A, 10A, 11A, 11C, 12A, 12B, 13A, and 13B are fragmentary cross-sectional views of an exemplary device according to various aspects of the present disclosure.

FIGS. 1B, 4B, 6B, 7B, 8B, 9B, 10B, and 11B are plane top-views of the exemplary device as shown in FIGS. 1A, 4A, 6A, 7A, 8A, 9A, 10A, and 11A (and 11C), respectively, according to various aspects of the present disclosure.

DETAILED DESCRIPTION

Figures 1A, 1B:
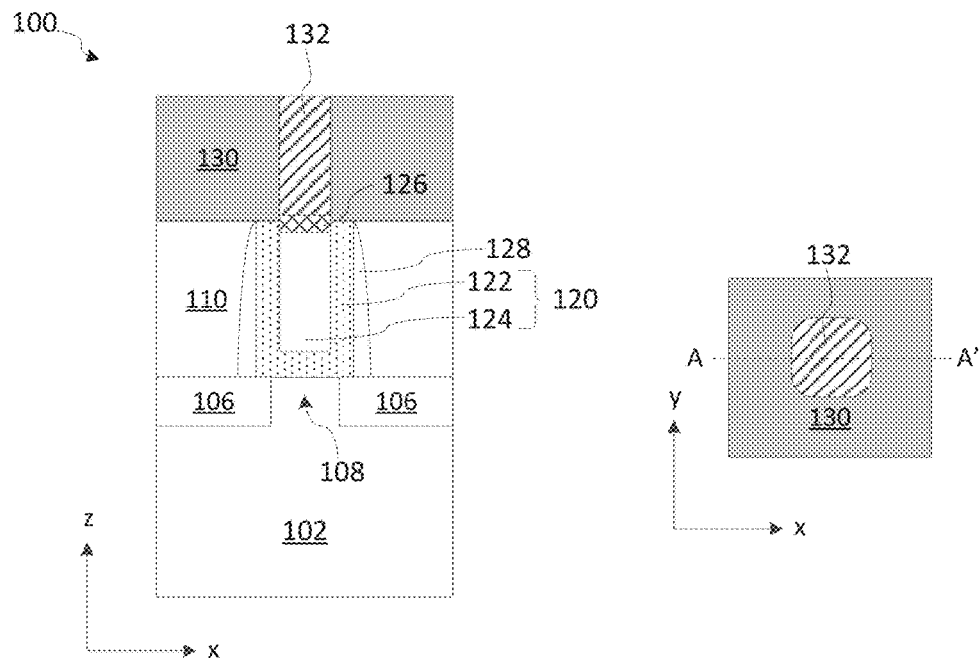

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of semiconductor device fabrication, and more particularly to methods of forming contact features on metal gate structures. Upon forming a metal gate structure in a device, contact features are formed over a top surface of the metal gate structure to further device fabrication. However, as features sizes continue to decrease, a number of challenges arise during this stage of the fabrication. In one example, multiple work-function metal (WFM) layers included in the metal gate electrode may result in a high-resistance interface with the contact feature, limiting the overall performance of the device. Furthermore, reduced feature size renders the electrical properties at the interface between the conductive feature and the top surface of the metal gate electrode difficult to control. Accordingly, the present disclosure provides structures aimed to reduce the contact resistance at the interface between metal gate structures and contact features. The semiconductor devices disclosed herein may be, for example, complementary metal-oxide-semiconductor (CMOS) devices comprising a p-type metal-oxide-semiconductor (PMOS) device and an n-type metal-oxide-semiconductor (NMOS) device. With respect to structures, the devices may be two-dimensional, planar MOS field-effect transistor (MOSFET) devices (FIGS. 1A-1B) or three-dimensional, non-planar fin-like field effect transistor (FinFET) devices (FIG. 2). It is understood, however, that the present disclosure should not be limited to a particular type of device.

Figure 2:
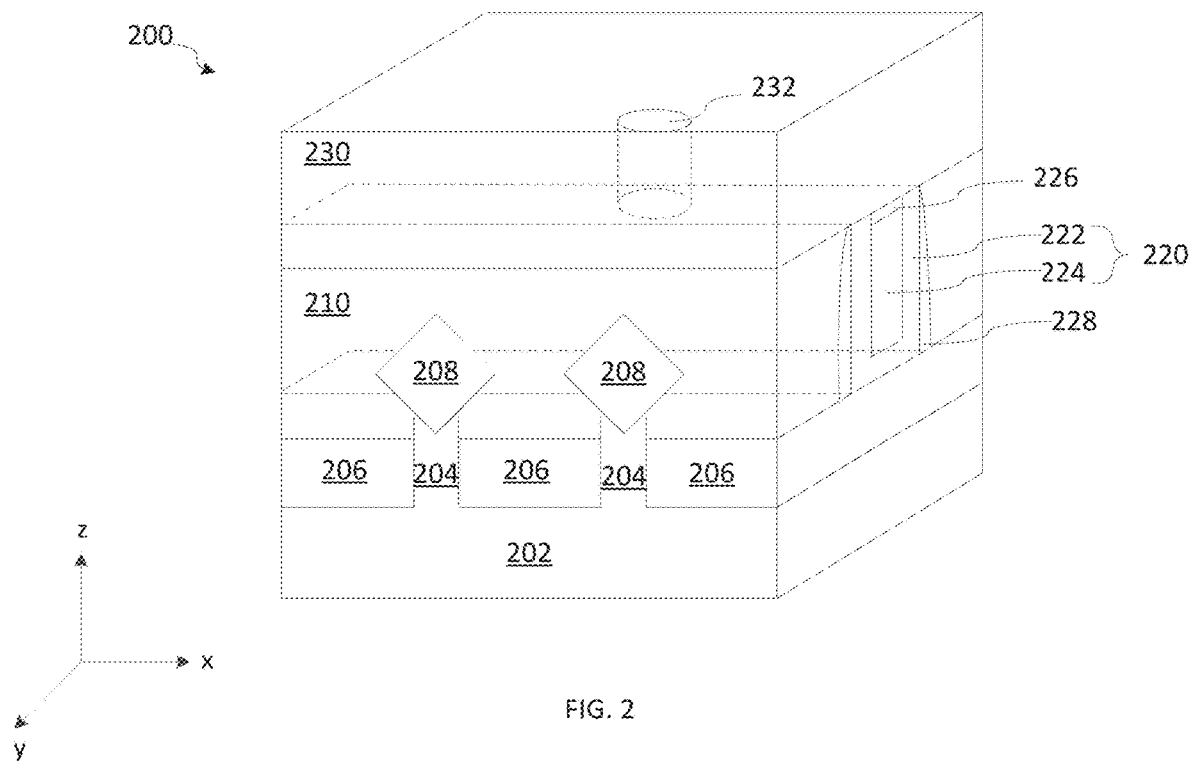
FIG. 2 is a three-dimensional perspective view of an exemplary device according to various aspects of the present disclosure.
Figure 3:
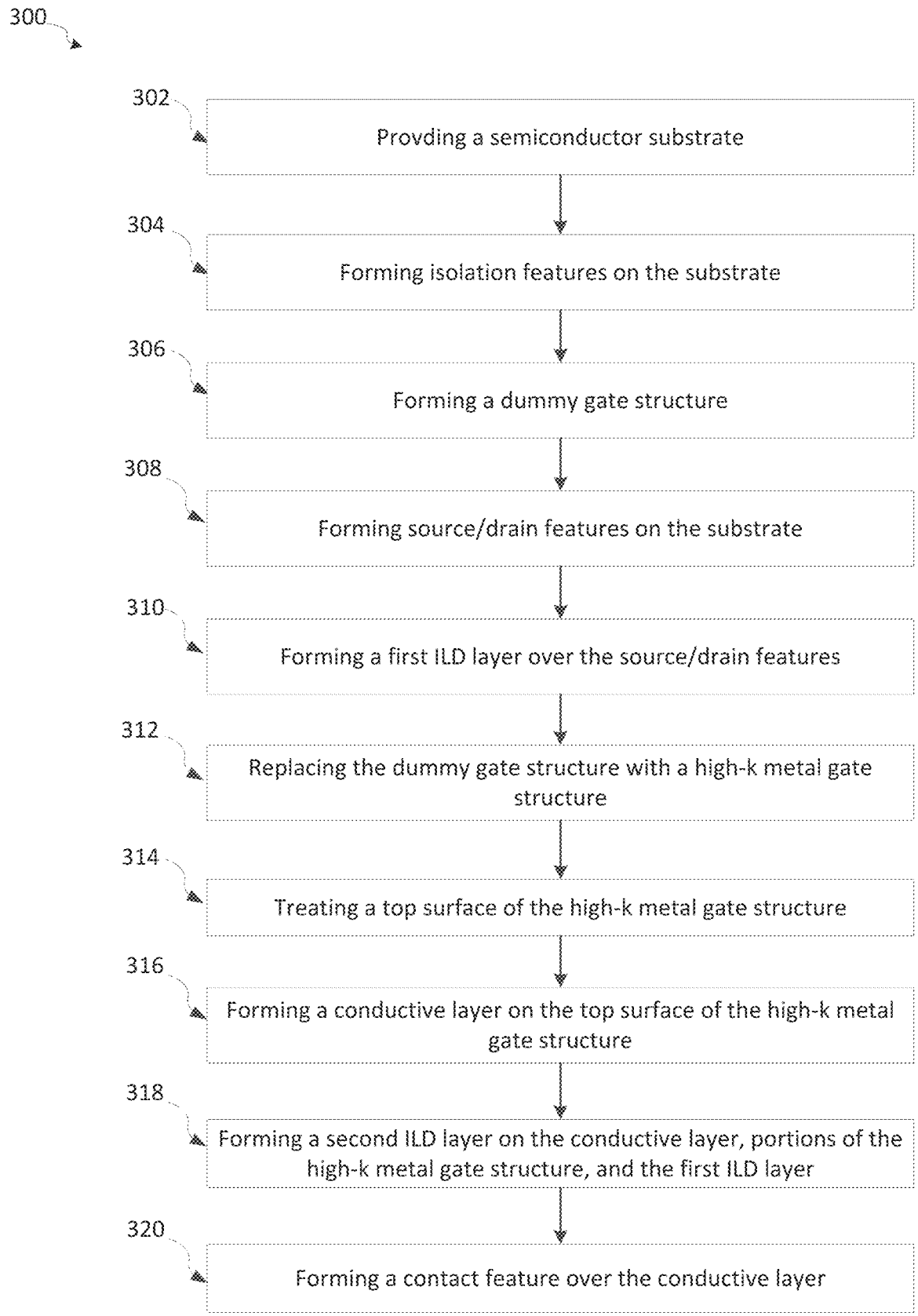
FIG. 3 is a flowchart of an exemplary method for fabricating a semiconductor device according to various aspects of the present disclosure.

FIG. 1A illustrates a cross-sectional view of a semiconductor device (or a semiconductor structure) 100 taken along line AA' of a plane top view of the device 100 as shown in FIG. 1B. In some embodiments, FIGS. 1A and 1B illustrate a two-dimensional, planar device such as, for example, a PMOS device, an NMOS device, or a portion of a CMOS device, while FIG. 2 illustrates a three-dimensional PMOS or NMOS FinFET device. FIG. 3 illustrates a flow chart of a method 300 for forming the semiconductor devices 100 and 200 according to various embodiments of the present disclosure. The method 300 is merely an example, and is not intended to limit the present disclosure beyond what is explicitly recited in the claims. Additional steps can be provided before, during, and after the processing methods provided herein, and some of the steps described can be replaced, eliminated, or moved around for additional embodiments of the present disclosure.

At operation 302, the method 300 provides a semiconductor substrate 102. The semiconductor substrate (or substrate) 102 includes an elementary semiconductor having a crystalline structure, such as, for example, silicon. Alternatively or additionally, the substrate 102 includes another elementary semiconductor, such as germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium phosphide, aluminum gallium arsenide, gallium indium arenside, gallium indium phosphide, and gallium indium arsenide phosphide; or combinations thereof. Alternatively, the substrate 102 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. The substrate 102 may further include other features such as a buried layer, and/or an epitaxial semiconductor layer grown in its upper portion. In some embodiments, the substrate 102 may include doped regions, such as n-wells and p-wells, depending upon the nature of a desired device. Doping the substrate 102 may be implemented by an ion implantation process, a diffusion process, an in-situ doping process, or combinations thereof.

At operation 304, the method 300 forms isolation features (not shown) on the substrate 102 to define active regions of the device 100. The isolation features may include, for example, silicon oxide, silicon nitride, silicon oxynitride, fluorine-doped silicate glass (FSG), a low-k dielectric material, other suitable dielectric materials, or combinations thereof. The isolation features can include structures such as shallow trench isolation (STI) structures, deep trench isolation (DTI) structures, and/or local oxidation of silicon (LOCOS) structures.

At operation 306, the method 300 forms a dummy gate structure (not shown)—portions of which are replaced in a subsequent step—over the substrate 102. The dummy gate structure may include a dummy interfacial layer comprising silicon oxide or silicon oxynitride and a dummy gate electrode comprising polysilicon. The dummy gate structure may be formed by a series of deposition and patterning processes. Thereafter, referring to FIGS. 1A and 4A, the operation 306 forms gate spacers 128 along sidewalls of the dummy gate structure. The gate spacers 128 may include a dielectric material, such as silicon oxide, silicon nitride, silicon oxynitride, silicon carbide, other dielectric material, or combinations thereof, and may be formed by a deposition process followed by an anisotropic etching process.

Figure 4A:
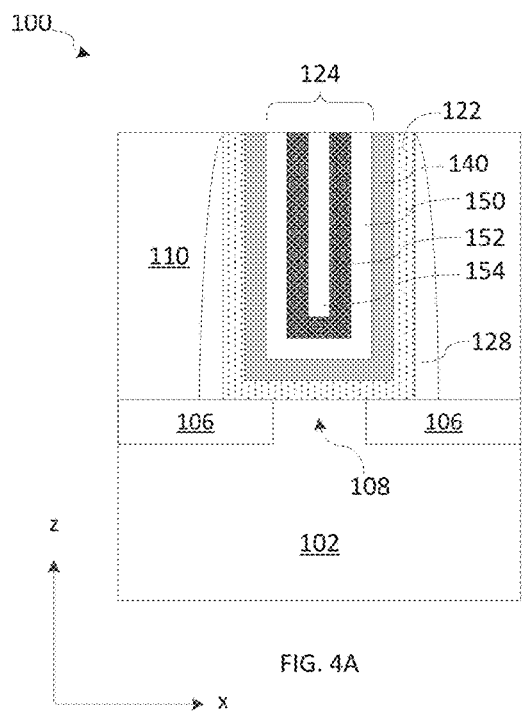

Referring to FIGS. 1A and 4A, the method 300 then proceeds to operation 308 to form source/drain features 106 adjacent to the dummy gate structure, thereby forming a channel region 108 below the dummy gate structure and between the source/drain features 106. The source/drain features 106 may be n-type features for forming NMOS devices or p-type features for forming PMOS devices. In some embodiments, the source/drain features 106 may be formed by doping the source/drain regions in the substrate 102 adjacent to the dummy gate structure with one or more n-type dopants or p-type dopants, depending on the nature of the devices desired, by a method such as ion implantation. In alternative embodiments, the operation 308 forms the source/drain features 106 by epitaxially growing doped semiconductor material layer(s) in the source/drain regions, thereby forming raised source/drain feature 106. In further embodiments, the operation 308 forms the source/drain feature 106 by first recessing portions of the source/drain regions by etching to form trenches and subsequently epitaxially growing semiconductor layer(s) in the trenches. The epitaxially grown semiconductor material may be the same or different from the semiconductor material of the substrate 102. For example, for a p-type FET, the epitaxially grown semiconductor material is silicon germanium while the epitaxially grown semiconductor material for an n-type FET is silicon or silicon carbide. In some embodiment, the dopant is introduced into the source/drain feature 106 by in-situ doping. Specifically, the precursor for epitaxial growth further includes the dopant-containing chemical.

Thereafter, at operation 310, the method 300 forms a first ILD layer 110 over the source/drain features 106 and the isolation features (FIGS. 1A and 4A). The first ILD layer 110 may comprise any suitable dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material and/or other suitable dielectric materials. The first ILD layer 110 may comprise a multilayer structure or a single layer structure having multiple dielectric materials. For example, the first ILD layer 110 may include a thin etch stop layer (such as silicon nitride) and a low-k dielectric material layer. The operation 310 forms the first ILD layer 110 by a deposition process, such as spin-on coating, chemical vapor deposition (CVD), other suitable methods, or combinations thereof. The operation 310 further includes implementing a planarization process, such as chemical-mechanical polishing/planarization (CMP), following the deposition of the first ILD layer 110 to remove excess ILD material from the top surface of the device 100.

Figure 4B:
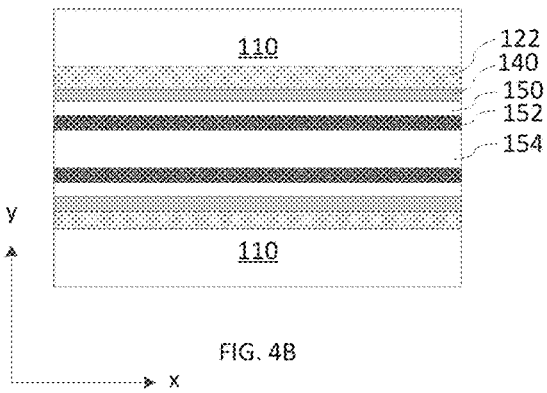

At operation 312, the method 300 replaces the dummy gate structure with a high-k metal gate (HK MG) structure 120 (FIGS. 1A, 4A, and 4B). The operation 312 removes portions of the dummy gate structure to form a gate trench (not shown) and subsequently forms the HK MG structure 120 in the gate trench by a deposition process. Thus formed gate material layers are U-shaped. Thereafter, a planarization process, such as CMP, is performed to remove excess metal gate material from the surface of the device 100.

Referring to FIGS. 1A, 4A, and 4B, the HK MG structure 120 includes a high-k gate dielectric (or gate dielectric) layer 122, a capping layer 140 disposed between the gate dielectric layer 122, and the gate electrode 124, and multiple metal layers 150, 152, and 154 that together form the gate electrode 124. In some embodiments, the gate electrode 124 may comprise additional metal layers. In further embodiments, the HK MG structure 120 may comprise additional material layers (not shown), such as interfacial layers, capping layers, diffusion layers, barrier layers, or combinations thereof. For example, the HK MG structure 120 may comprise an interfacial layer disposed between the active region 108 and the gate dielectric layer 122. Material layers of the HK MG structure 120 may be formed by one or more suitable methods such as CVD, physical vapor deposition (PVD), atomic layer deposition (ALD), plating, other suitable methods, or combinations thereof. In some embodiments, one or more deposition methods are implemented to form U-shaped gate dielectric layer 122, capping layer 140, metal layers 150, 152, and 154 of the gate electrode 124, and any other material layers disposed between them, respectively, such that the material layers are configured with top surfaces coplanar with each other.

The high-k dielectric layer 122 may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The gate dielectric layer 122 may be deposited using CVD, ALD, and/or other suitable methods.

In one embodiment, the capping layer 140 comprises one or more of the following: HfSiON, HfTaO, HfTiO, HfTaO, HfAlON, HfZrO, or other suitable materials. Thus, the operation 312 may further comprise, following forming the gate dielectric layer 122, co-sputtering the capping layer 140 on the gate dielectric layer 122 by a method such as rapid thermal anneal (RTA) implemented in nitrogen gas. In many embodiments, the capping layer 140 provides improved thermal stability for the HK MG 120 and serves to limit diffusion of metallic impurity from the gate electrode 124 into the gate dielectric layer 122.

The gate electrode 124 may include one or more metal layers, such as work function metal (WFM) layer(s), conductive barrier layer(s), and bulk conductive layer(s). The WFM layer may be a p-type or an n-type work function layer depending on the type of the device (PMOS or NMOS) desired. A p-type WFM layer comprises a metal with a sufficiently large effective work function and can comprise one or more of the following: titanium nitride (TiN) tantalum nitride (TaN), and tungsten nitride (WN), other suitable metals, or combinations thereof. An n-type WFM layer comprises a metal with sufficiently low effective work function and can comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, or combinations thereof. The bulk conductive layer may include aluminum (Al), copper (Cu), titanium (Ti), tantalum (Ta), tungsten (W), platinum (Pt), molybdenum (Mo), cobalt (Co), silver (Ag), manganese (Mn), zirconium (Zr), ruthenium (Ru), and/or other suitable materials. The gate electrode 124 may include multiple WFM layers or alternatively, multiple WFM layers and a bulk conductive metal layer. The gate electrode 124 may be formed by one or more deposition methods, such as CVD, PVD, ALD, plating, and/or other suitable methods.

In the depicted embodiments, the gate electrode 124 comprises multiple metal layers. For example, metal layers 150, 152, and 154 may be three distinct WFM layers of the same type (n-type or p-type). Alternatively, the metal layers 150 and 152 may be two distinct WFM layers, while the metal layer 154 may be a bulk conductive layer. In some embodiments, the gate electrode 124 may include additional WFM layers and bulk conductive layers.

Figure 5:
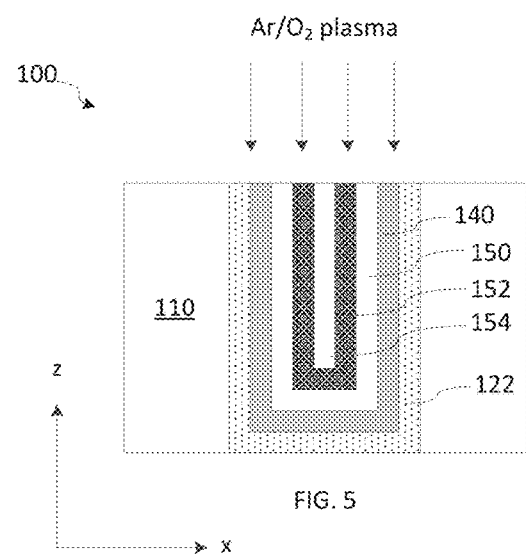

Referring back to FIG. 3, the method 300 proceeds to operation 314 to implement a surface treatment of the HK MG structure 120 in preparation for forming a conductive layer 126. In some embodiments, as shown in FIG. 5, the surface treatment is implemented by bombarding the top surface of the HK MG structure 120 with plasma comprising argon (Ar), ammonia (NH$_3$), other suitable gaseous species, or combinations thereof. The plasma may be implemented with an applied bias voltage in the range between about 1000 W and about 4000 W at an operation temperature between about 200 degree Celsius and 400 degree Celsius. In an exemplary embodiment, the duration of the treatment is about one minute. In the depicted embodiments, the surface treatment aims to remove any high-resistance materials at the top surface of the HK MG structure 120 and improves bonding between the conductive layer 126 and the top surface of the HK MG structure 120. Examples of high-resistance materials include native oxides formed on one or more of the WFM metal layers in the gate electrode 124. In some embodiments, the operation 314 is optional to the subsequent processing steps. Advantageously, the surface treatment implemented during the operation 314 may be carried out in the same tool as the subsequent steps of forming the conductive layer 126 and the contact feature 132.

In some embodiments, the implementation of the surface treatment at operation 314 leads to uniform growth of the conductive layer 126 over the multiple metal layers 150, 152, and 154, as the removal of high-resistance material (e.g., native oxides associated with WFM layers) at the top surface of the gate electrode 124 promotes bonding between the precursor material for the conductive layer 126 and the top surface of the gate electrode 124.

At operation 316, the method 300 forms the conductive layer 126 on the top surface of the HK MG structure 120 (i.e., the conductive layer 126 is parallel to and in contact with the top surface of the HK MG structure 120) by a deposition process. In the present embodiment, the operation 316 implements an ALD process. As depicted in FIG. 6A, the operation 316 begins with sequentially exposing the top surface of the HK MG structure 120 to two different gaseous precursors in a cyclic manner, i.e., alternating application of a first gaseous precursor 620 and a second gaseous precursor 622 to the top surface of the HK MG structure 120. In some embodiments, the deposition process implemented by the operation 316 is a selective deposition process such that the conductive layer 126 is selectively formed on and self-aligned with the top surface of the gate electrode 124.

The first gaseous precursor 620 may comprise a compound including a conductive element, such as W, Co, Ti, Al, Cu, Au, or combinations thereof, and a halogen, such as chlorine (Cl) or fluorine (F). In exemplary embodiments, the first gaseous precursor 620 may be tungsten chloride (WCl$_5$), tungsten fluoride (WF$_6$), titanium chloride (TiCl$_4$), or other suitable materials. The second gaseous precursor 622 comprises elements such as silicon (Si) and hydrogen (H). Examples of the second gaseous precursor 622 include hydrogen (H$_2$) and silane (SiH$_4$). The operation 316 implements the deposition process at a temperature ranging between about 400 C and about 520 C with a processing pressure ranging between about 5 Torr and 50 Torr. In some embodiments, the deposition process may be carried out for about 10 minutes to about 40 minutes.

In some embodiments, the conductive layer 126 includes metals selected from tungsten (W), cobalt (Co), titanium (Ti), aluminum (Al), copper (Cu), gold (Au), other suitable metals, or combinations thereof. In an exemplary embodiment, the conductive layer 126 comprises W, Co, or Al. As a contact feature (e.g. contact feature 132 or 134 of FIGS. 8A and 10A, respectively) formed over a metal gate structure generally comprise conductive materials similar to those of the conductive layer 126, the contact resistance at the interface between the contact feature 132 or 134 and the conductive layer 126 is generally lower than the contact resistance between the conductive layer 126 and the top surface of the gate electrode 124, which may comprise multiple high-resistance WFM layers.

In some embodiments, as illustrated in FIGS. 6A-6B, 7A-7B, and 8A-8B, the conductive layer 126 is self-aligned with the metal layers 150, 152, and 154 of the gate electrode 124 and is not formed over the gate dielectric layer 122 or the capping layer 140. However, as shown in FIGS. 9A-9B and 12A-12B, the conductive layer 126 may also be formed on the top surface of the gate dielectric layer 122 and/or the capping layer 140 by controlling the deposition time during the operation 316. In one example, prolonged deposition time may cause the conductive layer 126 to extend laterally over the top surface of the capping layer 140 and/or the gate dielectric layer 122, which can increase the contact area between the subsequent formed contact feature and the gate electrode 124 even when misalignment between the two may be present (e.g., contact feature 134 in FIGS. 10A-10B).

In some embodiments, a portion of the conductive layer 126 may be embedded below the top surface of the gate electrode 124 and the embedded portion may include an interfacial layer 610 that comprises chemical elements included in both the gate electrode 124 (e.g., one or more of the metal layers 150, 152, and 154) and the conductive layer 126. An enlarged illustration of the embedded portion of the conductive layer 126 is shown in FIG. 6C. The interfacial layer 610 may comprise one or more of the following elements: tungsten (W), cobalt (Co), copper (Cu), gold (Au), titanium (Ti), tantalum (Ta), aluminum (Al), carbon (C), silicon (Si), nitrogen (N), and other suitable elements present in the gate electrode 124 and the conductive layer 126. In some embodiments, the interfacial layer 610 may be the bottom-most portion of the conductive layer 126 that is in contact with the gate electrode 124. Alternatively, the entirety of the conductive layer 126 embedded below the top surface of the gate electrode 124 constitutes the interfacial layer 610. In some embodiments, the interfacial layer 610 may be formed as a result of molecular intermixing between the material of the conductive layer 126 and the gate electrode 124 (e.g., one or more of the metal layers 150, 152, and 154), such that the interfacial layer 610 comprises the chemical elements (schematically shown as species 612, 614, 616, and 618) of both the conductive layer 126 and the gate electrode 124, though the elements may form a composition different from that of the conductive layer 126 or of the metal layers of the gate electrode 124.

Figure 7A:
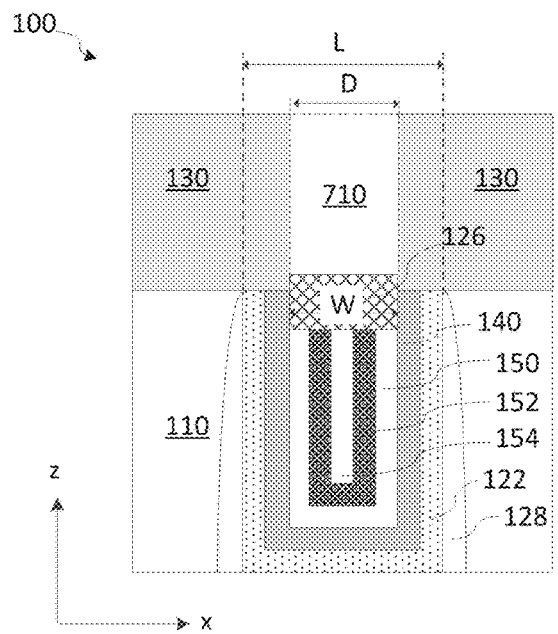
Figure 7B:
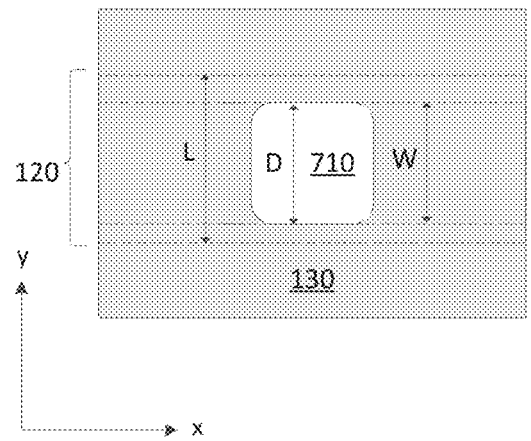

At operation 318, referring to FIGS. 7A-7B, the method 300 forms a second ILD layer 130 over the conductive layer 126, portions of the HK MG structure 120, and the first ILD layer 110. The second ILD layer 130 may comprise a material that is the same as or different from the first ILD layer 110, and may be, for example, TEOS, un-doped silicate glass, BPSG, FSG, PSG, BSG, low-k dielectric material, and/or other suitable dielectric. The operation 318 forms the second ILD layer 130 by a deposition process, such as spin-on coating, CVD, other suitable methods, or combinations thereof. The operation 318 may further include implementing a CMP process to remove excess ILD material from the top surface of the device 100.

The method 300 proceeds to operation 320 to form contact feature 132. The operation 320 may include multiple steps, such as patterning, deposition, and CMP. First, the operation 320 performs a patterning process (including lithography process and etching) to form (i.e., to pattern) an opening 710 in the second ILD layer 130 which corresponds to a planar shape of the contact feature 132 from a top view (FIG. 7B). In many embodiments, the contact feature 132 is configured to have a circular (e.g., the contact feature 232 of the FinFET device 200 in FIG. 2), square, rectangle, or other planar shapes. In the depicted embodiment, the opening 710 is formed directly above the top surface of the gate electrode 124 (i.e., metal layer 150, 152, and 154) and has a width D aligned with a gate length W. The patterning process may include forming a patterned resist layer (not shown) over a hard mask layer (not shown) via photoresist coating, exposing, post-exposure baking, and developing. The hard mask layer may include a material different from that of the ILD layer 130, such as silicon oxide, silicon nitride, silicon carbide, silicon oxynitride, or other suitable materials, and may be formed by a suitable method, such as thermal oxidation, CVD, PVD, ALD, other suitable methods, or a combination thereof. Thereafter, the hard mask layer is etched using the patterned photoresist as an etch mask to form the opening in the second ILD layer 130. The etching process may include wet etching, dry etching, reactive ion etching, or other suitable etching methods.

Figure 8A:
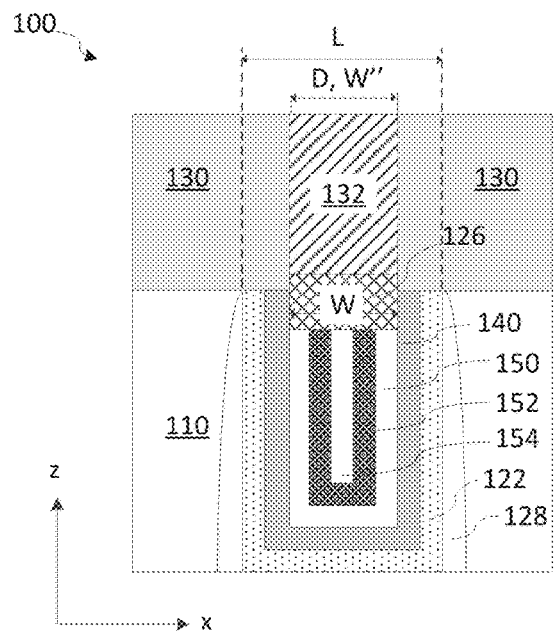
Figure 8B:
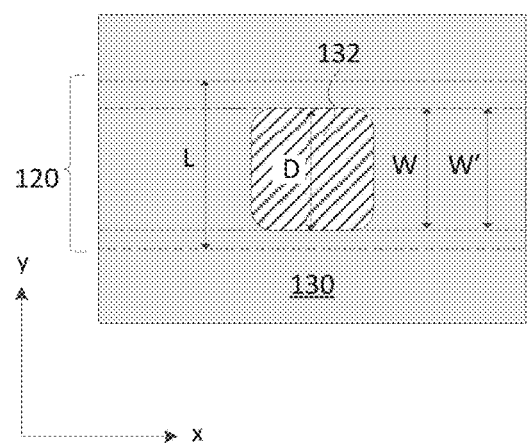

Then, referring to FIGS. 8A-8B, the contact feature 132 is formed in the opening 710 of the second ILD layer 130 by deposition. In some embodiments, the contact feature 132 comprises tungsten (W), cobalt (Co), aluminum (Al), copper (Cu), titanium (Ti), tantalum (Ta), platinum (Pt), molybdenum (Mo), silver (Ag), manganese (Mn), zirconium (Zr), ruthenium (Ru), other suitable conductive materials, or combinations thereof. The contact feature 132 may comprise a material that is the same as or different from the conductive layer 126. For example, if the conductive layer 126 comprises metallic tungsten, then the contact feature 132 may comprise metallic tungsten, metallic cobalt, and/or metallic aluminum. In some embodiments, the operation 320 forms the contact feature 132 by a deposition process such as CVD, PVD, ALD, plating, other suitable methods, or combinations thereof. In an exemplary embodiment, the contact feature 132 is formed by a CVD process, which is different from ALD. In the depicted embodiments, the contact feature 132 is formed using a continuous deposition technique, during which a single gaseous species is used to complete the deposition process. Advantageously, the contact resistance at the interface between the contact feature 132 and the conductive layer 126 is generally lower than the contact resistance at the interface between the contact feature 132 and the top surface of the gate electrode 124 (including metal layers 150, 152, and 154), thereby mitigating the effect of high-resistance interface between the multiple WFM layers of the HK MG structure 120 and the contact feature 132. Thereafter, one or more planarization process, such as CMP, may be performed to remove any excess material from the top surface of the device 100.

Figure 9A:
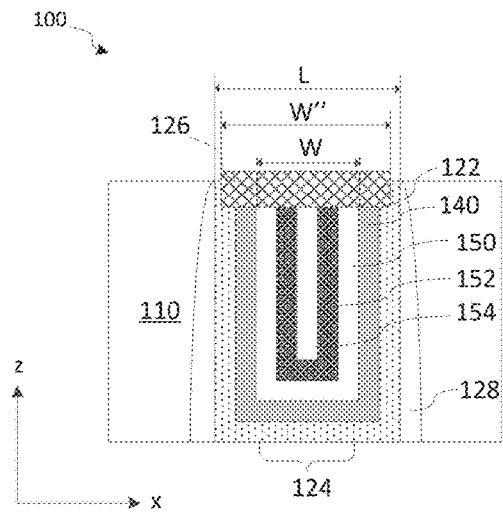
Figure 9B:
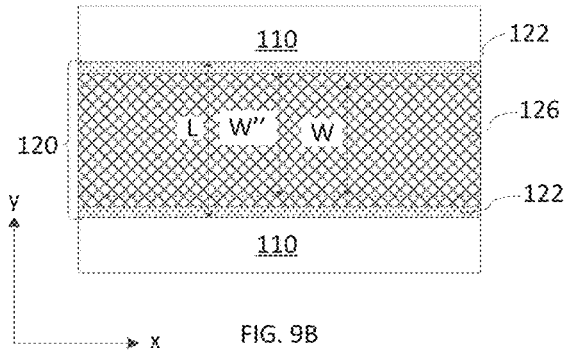

In an alternative embodiment, referring to FIGS. 9A-9B, instead of selectively depositing the conductive layer 126 over the top surface of the gate electrode layer 124 at the operation 316, portions of the conductive layer 126 are formed over the capping layer 140 and/or the gate dielectric layer 122, such that a length W" of the conductive layer 126 is greater than the gate length W but less than a total length L (including the gate dielectric layer 122 and the capping layer 140). In many embodiments, the deposition process of the conductive layer 126 is controlled such that the length W" is at least the gate length W (as in the case of selective deposition) but not exceeding the total length L so as to prevent electrical shorting of the HK MG 120 during device operation. In an exemplary embodiment, the difference between W" and W is less than about 60% of the total length L. In another exemplary embodiment, (W"−W)/2 is less than about 4 nm.

Figure 10A:
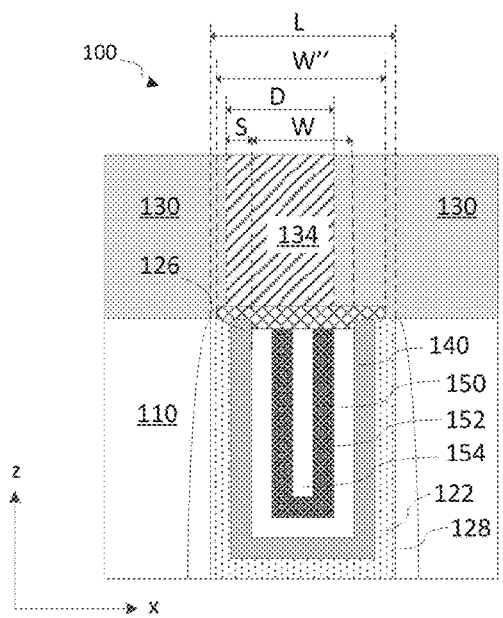
Figure 10B:
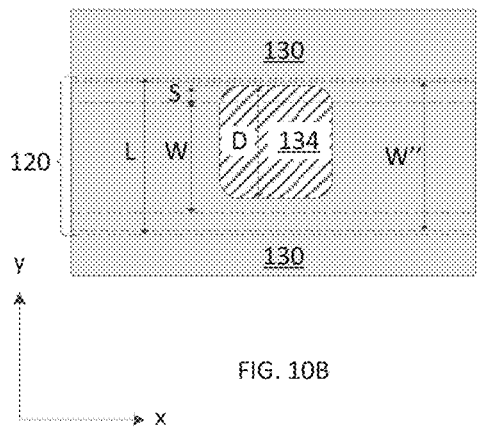

Then, referring to FIGS. 10A-10B, the method 300 forms the second ILD layer 130 (at operation 318), forms an opening (not shown) in the second ILD layer 130 (at operation 318), and subsequently deposits a conductive material in the opening to form the contact feature 134 (at operation 320). The opening may be formed in a manner similar to that discussed above with respect to the opening 710. In the depicted embodiment, the width D of the contact feature 134 (i.e., of the opening formed in the second ILD 130) is offset from the gate length W by a distance S, indicating that misalignment has occurred during the patterning process. In some embodiments, the offset distance S is less than about 30% of the total length L and may be formed on either side of the top surface of the gate electrode 124. However, since W" is greater than both D and W, the contact feature 134 can still establish a low-resistance interface with the conductive layer 126 despite the misalignment S. As discussed above, the conductive layer 126 may extend laterally to contact top surfaces of the capping layer 140 and/or the gate dielectric layer 122 by increasing the deposition time of the first 620 (e.g., $WCl_5$ and $WF_6$) and/or the second 622 (e.g., $SiH_4$ and $H_2$) gaseous species implemented in a cyclic manner during the operation 316.

Figure 11A:
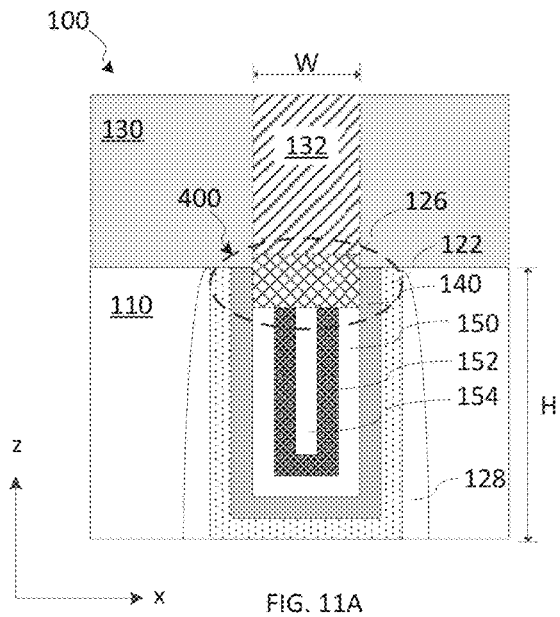
Figure 11C:
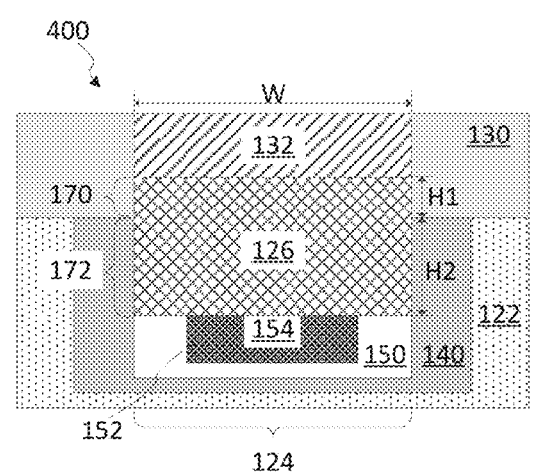
Figure 11B:
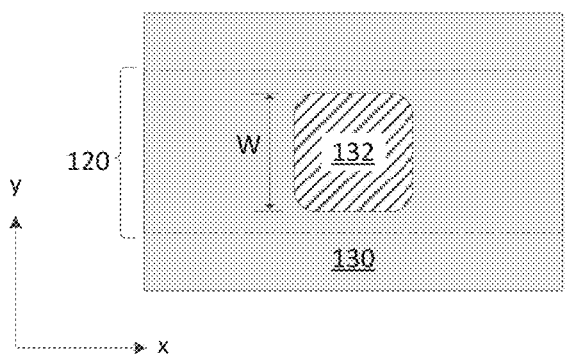

Various embodiments of the device 100 following the formation of the contact feature 132 (or 134) are discussed in detail below. It is understood that the conductive layer 126 may comprise any one or combination of features discussed below with respect to FIGS. 11A-11C, 12A-12B, and 13A-13B. As depicted in FIG. 11C, which is an enlarged illustration of a portion 400 of the FIG. 11A, the conductive layer 126 is configured to have a first portion 170 having a height of H1 formed above a top surface of the gate electrode 124 (comprising the metal layers 150, 152, and 154) and a second portion 172 having a depth of H2 embedded below the top surface of the gate electrode 124. The magnitude of H1 may be controlled such that the length of the conductive layer 126 (which is substantially the same as the gate length W as shown in FIGS. 11A-11C) does not extend over the top surface of the gate dielectric layer 122 in order to avoid potential shorting of the HK MG 120. On the other hand, H2 needs to be controlled in order to minimize the influence the conductive layer 126 has on the WFM layers (e.g., 150, 152, and 154). In one exemplary embodiment, H1 measures between about 1 nm and about 3 nm, while H2 measures between about 0 nm and about 8 nm. For embodiments in which H2>0 nm, the ratio of H1/H2 ranges between about 0.1 to about 1.5. In another exemplary embodiment, the total length L ranges between about 13 nm and about 28 nm, while the gate height H (FIG. 11A) ranges between about 10 nm and 35 nm.

Figure 12A:
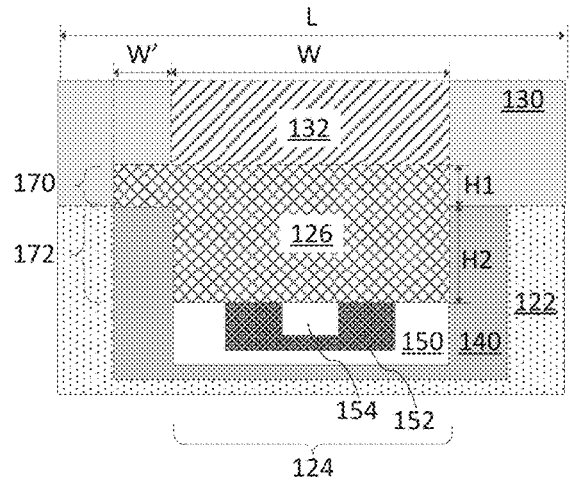
Figure 12B:
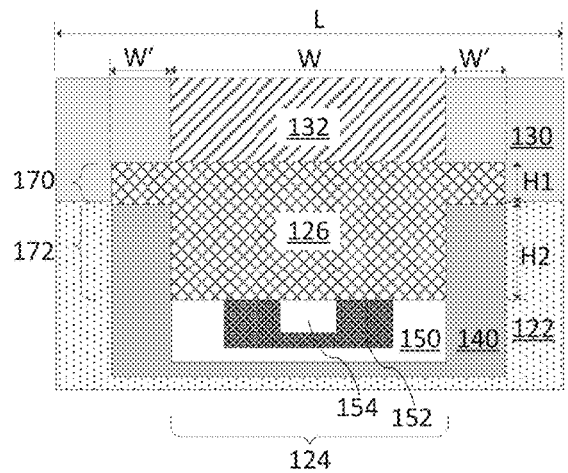

In some embodiments, as depicted in FIGS. 11-11C and 13A-13B, the conductive layer 126 is self-aligned with the metal layers 150, 152, and 154 of the gate electrode 124 and is not formed on the gate dielectric layer 122 or on the capping layer 140. In alternative embodiments, as depicted in FIGS. 12A-12B, at least a portion of the conductive layer 126 extends to contact the top surfaces of the gate dielectric layer 122 and/or the capping layer 140 on either (FIG. 12A) or both (FIG. 12B) sides of the gate electrode 124, which has the length W. In some embodiments, the portion of the conductive layer 126 formed on the top surfaces of the gate dielectric layer 122 and/or the capping layer 140 has a length W' such that W+W' (FIG. 12A) and W+2×W' (FIG. 12B) do not exceed the total length L in order to avoid shorting of the HK MG 120.

In some embodiments, as depicted in FIGS. 11A-11C and 12A-12B, the conductive layer 126 is configured to have a top and a bottom surface parallel to the top surface of the metal gate structure 120 across the metal layers 150, 152, and 154. Alternatively, as depicted in FIGS. 13A-13B, the conductive layer 126 is configured to have a top and a bottom surface tapered with respect to the top surface of the metal gate structure 120 such that the thickness of the first portion 170 is greater at the center than at the outer edges of the conductive layer 126.

Figure 13A:
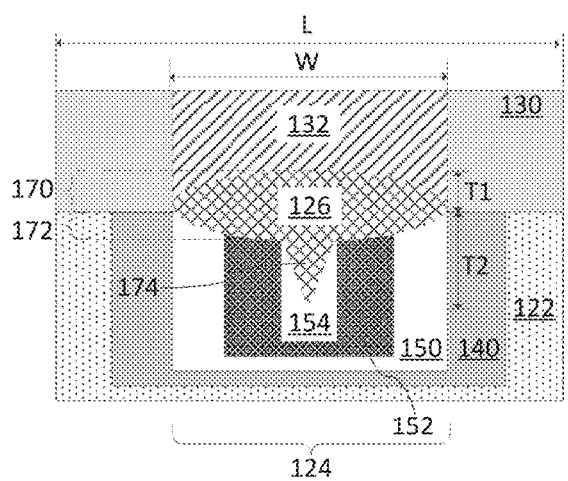
Figure 13B:
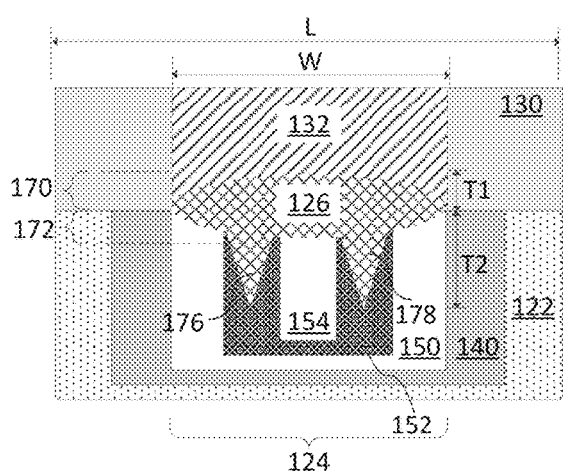

In some embodiments, the conductive layer 126 is further configured to have a third portion 174 shown in FIG. 13A that preferentially penetrates into the metal layer 154 but not into the metal layers 150 or 152. Alternatively, as depicted in FIG. 13B, the conductive layer 126 is configured to have two portions, 176 and 178, formed preferentially into the metal layer 152 but not into the metal layers 150 or 154. Though depicted as having a conical growth profile, portions 174, 176, and 178 may be configured to have other geometric profiles. As such, T1 is a distance measured from a highest point of the conductive layer 126 (i.e., of the portion 170) to the top surface of the HK MG 120, while T2 is a distance measured from a lowest point of the conductive layer 126 (i.e., of the portions 174, 176, or 178). Similar to H1 and H2, magnitude of T1 and T2 are controlled in order to avoid shorting of the HK MG 120 while minimizing the effect of the conductive layer 126 on the WFM layers (e.g., 150, 152, and 154). In an exemplary embodiment, the ratio T1/T2 is between about 0.1 and about 1.5. In exemplary embodiments, Ti measures between about 1 nm and about 3 nm, while T2 measures between about 2 nm and about 8 nm.

Embodiments of the method 300 may also be implemented to form a three-dimensional, non-planar device such as a FinFET device 200 depicted in FIG. 2. In some embodiments, the method 300 provides a semiconductor substrate 202 and forming fins 204 isolated by isolation structures 206. The method 300 proceeds to forming a dummy gate structure (not shown) and gate spacers 228 over the fins 204 and the isolation features 206. Then, the method 300 forms source/drain features 208 on the fins 204, followed by depositing a first ILD layer 210 over the isolation features 206 and the source/drain features 208. The method 300 then replaces the dummy gate structure with a high-k metal gate structure 220. Features of the device 200 may include similar compositions and be fabricated using similar methods as their counterparts of the device 100. For example, similar to the HK MG structure 120, the metal gate structure 220 comprises a high-k gate dielectric layer 222 and a gate electrode 224, which may further include multiple conductive material layers. The metal gate structure 220 may further comprise additional material layers (not shown) such as, for example, interfacial layers, capping layers, diffusion layers, barrier layers, or combinations thereof. The method 300 further implements a conductive layer 226 similar to the conductive layer 126 of the device 100 over the top surface of the HK MG structure 220. Thereafter, a second ILD layer 230 similar to the second ILD layer 130 of the device 100 is deposited over the conductive layer 226, portions of the HK MG structure 220, and the first ILD layer 210, and a contact feature 232 is formed in the second ILD layer 230 in a manner similar to that described with respect to forming the contact feature 132.

Although not limiting, one or more embodiments of the present disclosure offer improvements for semiconductor devices and methods of fabricating the same. For example, embodiments of the present disclosure provide a conductive layer disposed between a metal gate structure and a contact feature in order to reduce high resistance at the interface between the metal gate structure and the contact feature caused by one or more work-function metal layers present in the metal gate structure. Further, by controlling conditions for deposition, the conductive layer can be selectively formed over the gate electrode or non-selectively formed on both the gate electrode and the insulating material layers of the metal gate structure. The latter configuration increases the contact area between the contact feature and the conductive layer, which may help mitigate the effect of misalignment that may have occurred when forming the contact feature.

The semiconductor device 100 may be included in a microprocessor, a memory, and/or other integrated circuit device. In some embodiments, the semiconductor device 100 may be a portion of an IC chip, a system on chip (SoC), or portion thereof, that includes various passive and active microelectronic devices such as resistors, capacitors, inductors, diodes, metal-oxide semiconductor field effect transistors (MOSFET), CMOS transistors, bipolar junction transistors (BJTs), laterally diffused MOS (LDMOS) transistors, high voltage transistors, high frequency transistors, other suitable components, or combinations thereof. Additional features can be added to the semiconductor device 100 by subsequent processing steps. For example, various vertical interconnect features such as contacts and/or vias, and/or horizontal interconnect features such as lines, and multilayer interconnect features such as metal layers and interlayer dielectrics can be formed over the substrate 102, configured to connect the various features or structures of the semiconductor device 100.

Accordingly, the present disclosure provides many different embodiments for fabricating a semiconductor device. In one aspect, the present disclosure provides a semiconductor structure that includes a metal gate structure comprising a gate dielectric layer and a gate electrode, a conductive layer formed on a top surface of the metal gate structure, a portion of the conductive layer being embedded below a top surface of the metal gate structure, and a contact feature disposed on the top surface of the metal gate structure, the contact feature being in direct contact with a top surface of the conductive layer.

In some embodiments, the gate dielectric layer has a top surface coplanar with a top surface of the gate electrode, and the conductive layer is self-aligned with the top surface of the gate electrode but not with the top surface of the gate dielectric layer.

In some embodiments, the metal gate structure further includes a capping layer having a top surface coplanar with the top surface of the gate electrode, where the conductive layer is self-aligned with the top surface of the gate electrode but not with the top surface of the capping layer. In some embodiments, the capping layer comprises hafnium (Hf).

In some embodiments, a top surface of the conductive layer is above the top surface of the metal gate structure such that a ratio of a distance between a highest point of the conductive layer and the top surface of the metal gate structure to a distance between a lowest point of the conductive layer and the top surface of the metal gate structure is between 0.1 and 1.5.

In some embodiments, the gate electrode includes two different metal layers, and the conductive layer is in direct contact with both metal layers. In further embodiments, the conductive layer preferentially penetrates into one of the two different metal layers.

In some embodiments, the conductive layer includes metallic tungsten, while the contact feature comprises metallic cobalt. In some embodiments, the portion of the conductive layer embedded below the top surface of the metal gate structure includes an interfacial layer that comprises at least one element selected from tungsten and nitrogen. In further embodiments, the interfacial layer further includes at least one element selected from titanium, aluminum, tantalum, carbon, and silicon.

In some embodiments, a contact resistance at an interface between the contact feature and the conductive layer is lower than a contact resistance at an interface between the contact feature and the metal gate structure.

In another aspect, the present disclosure provides a semiconductor structure that includes a metal gate structure comprising a U-shaped gate dielectric layer and a gate electrode, the gate electrode including at least one U-shaped metal layers, a portion of the conductive layer penetrating into the gate electrode such that amount of the conductive layer decreases with an increasing depth of penetration, and a contact feature disposed on the top surface of the metal gate structure, the contact feature being in direct contact with a top surface of the conductive layer.

In some embodiments, the gate electrode includes two different metal layers, and the portion of the conductive layer that penetrates into the gate electrode preferentially penetrates into one of the two different metal layers.

In some embodiments, the conductive layer comprises a portion formed above the top surface of the metal gate structure such that a ratio of a distance between a highest point of the conductive layer and the top surface of the metal gate structure to a distance between a lowest point of the conductive layer and the top surface of the metal gate structure is between 0.1 and 1.5. In further embodiments, the gate dielectric layer has a top surface coplanar with a top surface of the gate electrode, and the portion formed above the top surface of the metal gate structure extends laterally to contact the top surface of the gate dielectric layer.

In yet another aspect, the present disclosure provides a method of forming a semiconductor device that includes forming a metal gate structure, which includes a gate dielectric layer and a gate electrode, where top surfaces of the gate dielectric layer and the gate electrode are coplanar, selectively depositing a conductive layer by a cyclic deposition technique using more than one gaseous species over a top surface of the gate electrode, and forming a contact feature over the conductive layer by a continuous deposition technique suing a single gaseous species. In some embodiments, the method further includes applying plasma to an exposed top surface of the gate electrode prior to selectively depositing the conductive layer, where applying the charged plasma and selectively depositing the conductive layer are implemented in a same tool.

In some embodiments, forming the metal gate structure further includes sputtering a capping layer between the gate dielectric layer and the gate electrode, wherein the capping layer comprises hafnium (Hf).

In some embodiments, both the conductive layer and the contact feature comprise metallic tungsten. In alternative embodiments, the conductive layer comprises metallic tungsten and the contact feature comprises metallic cobalt.

In some embodiments, the gate electrode includes two different metal layers, wherein the conductive layer directly contacts top surfaces of both metal layers.

In some embodiments, selectively depositing a conductive layer includes controlling time of depositing such that a portion of the conductive layer laterally extends to contact a top surface of the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a metal gate structure comprising a gate dielectric layer and a gate electrode;
a conductive layer disposed over the metal gate structure, the conductive layer including a bottom portion disposed below a top surface of the metal gate structure and a top portion disposed over the top surface of the metal gate structure, and wherein the top portion laterally extends beyond a sidewall of the bottom portion; and
a contact feature in direct contact with the top portion of the conductive layer.

2. The semiconductor structure of claim 1, wherein the sidewall of the bottom portion of the conductive layer is defined by the gate dielectric layer.

3. The semiconductor structure of claim 1, wherein the sidewall of the bottom portion of the conductive layer is defined by the gate electrode.

4. The semiconductor structure of claim 1, further comprising a capping layer disposed between the gate dielectric layer and the gate electrode, wherein the sidewall of the bottom portion of the conductive layer is defined by the capping layer.

5. The semiconductor structure of claim 1, wherein the top portion of the conductive layer extends to contact the gate dielectric layer.

6. The semiconductor structure of claim 1, further comprising an interlayer dielectric (ILD) layer disposed over the metal gate structure and surrounding the contact feature, wherein a sidewall of the top portion of the conductive layer is defined by the ILD layer.

7. The semiconductor structure of claim 1, wherein the top portion of the conductive layer is embedded in the contact feature.

8. The semiconductor structure of claim 1, further comprising an interfacial layer disposed between the conductive layer and the top surface of the metal gate structure, wherein the interfacial layer includes one or more chemical element included in the conductive layer, the gate electrode, or a combination thereof.

9. A semiconductor structure, comprising:
a gate stack including a high-k gate dielectric layer and a metal gate electrode disposed over the high-k gate dielectric layer;
a metal layer disposed over the gate stack, wherein the metal layer includes a first portion disposed over a second portion; and
a gate contact in direct contact with the first portion of the metal layer, wherein sidewalls of the first portion of the metal layer are defined by the gate contact, and wherein sidewalls of the second portion of the metal layer are defined by the metal gate electrode.

10. The semiconductor structure of claim 9, wherein a width of the second portion of the metal layer decreases with a distance away from a top surface of the gate stack.

11. The semiconductor structure of claim 9, wherein the metal gate electrode includes a first layer and a second layer over the first layer, wherein the first layer and the second layer have different compositions, and wherein the sidewalls of the second portion of the metal layer are defined by the first layer but not the second layer.

12. The semiconductor structure of claim 9, wherein the metal gate electrode includes a first layer and a second layer over the first layer, wherein the first layer and the second layer have different compositions, and wherein the sidewalls of the second portion of the metal layer are defined by the second layer but not the first layer.

13. The semiconductor structure of claim 9, further comprising an interfacial layer disposed between the metal layer and a top surface of the gate stack, wherein composition of the interfacial layer is different from composition of the metal layer and composition of the metal gate electrode.

14. The semiconductor structure of claim 9, wherein contact resistance at an interface between the gate contact and the metal layer is lower than contact resistance at an interface between the metal layer and the gate stack.

15. A semiconductor structure, comprising:
a gate stack including a high-k gate dielectric layer and a metal gate electrode disposed over the high-k gate dielectric layer;
a conductive layer disposed on the gate stack, wherein the conductive layer includes a top portion disposed over a bottom portion, wherein the top portion laterally spans a first distance, and wherein the bottom portion penetrates the gate stack and laterally spans a second distance that is less than the first distance; and
a gate contact in direct contact with the top portion of the conductive layer.

16. The semiconductor structure of claim 15, wherein the top portion of the conductive layer extends to contact the high-k gate dielectric layer, and wherein the bottom portion of the conductive layer are embedded in the metal gate electrode.

17. The semiconductor structure of claim 15, wherein the gate stack further includes a capping layer disposed between the high-k gate dielectric layer and the metal gate electrode, wherein the top portion of the conductive layer extends to contact a top surface of the capping layer, and wherein sidewalls of the bottom portion of the conductive layer are defined by the capping layer.

18. The semiconductor structure of claim 15, wherein the metal gate electrode includes a first metal layer and a second metal layer disposed over the first metal layer, wherein the first metal layer and the second metal layer differ in composition, and wherein the bottom portion of the conductive layer preferentially penetrates the first metal layer with respect to the second metal layer.

19. The semiconductor structure of claim 15, wherein the metal gate electrode includes a first metal layer and a second metal layer disposed over the first metal layer, wherein the first metal layer and the second metal layer differ in composition, and wherein the bottom portion of the conductive layer preferentially penetrates the second metal layer with respect to the first metal layer.

20. The semiconductor structure of claim 15, further comprising an interfacial layer disposed between the conductive layer and a top surface of the metal gate electrode, wherein the interfacial layer differs from both the conductive layer and the metal gate electrode in composition.

\* \* \* \* \*